(12) United States Patent
Ashida et al.

(10) Patent No.: US 7,348,637 B2
(45) Date of Patent: *Mar. 25, 2008

(54) SEMICONDUCTOR DEVICE AND METHOD OF MANUFACTURING THE SAME

(75) Inventors: Motoi Ashida, Tokyo (JP); Takashi Terada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/376,142

(22) Filed: Mar. 16, 2006

(65) Prior Publication Data

US 2006/0180872 A1    Aug. 17, 2006

Related U.S. Application Data

(63) Continuation of application No. 10/619,431, filed on Jul. 16, 2003, now Pat. No. 7,038,281.

(30) Foreign Application Priority Data

Feb. 28, 2003   (JP) ............................... 2003-53090

(51) Int. Cl.
*H01L 29/72* (2006.01)
(52) U.S. Cl. .................. 257/371; 257/372; 257/374
(58) Field of Classification Search ................ 257/371, 257/372, 374

See application file for complete search history.

(56) References Cited

U.S. PATENT DOCUMENTS

| 5,220,218 | A | 6/1993 | Hill et al. |
| 5,338,699 | A | 8/1994 | Ohi et al. |
| 5,899,742 | A | 5/1999 | Sun |
| 6,174,775 | B1 | 1/2001 | Liaw |
| 7,038,281 | B2 * | 5/2006 | Ashida et al. ............... 257/371 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A semiconductor device including plural CMOS transistors with first and second transistors sharing a common first gate electrode and third and fourth transistors sharing a common second gate electrode that is adjacent and parallel to the first gate electrode. The first and third transistors share a common n-type channel MOS region and the second and fourth transistors share a common p-type channel MOS region. The semiconductor device has a wire connecting the n-type channel MOS region and the p-type channel MOS region. The wire has a width greater than a distance between the first and second adjacent gate electrodes, and a portion of the wire is disposed right above a portion of at least one of the first and second gate electrodes with an insulating film interposed therebetween.

9 Claims, 8 Drawing Sheets

SEMICONDUCTOR DEVICE AND METHOD OF MANUFACTURING THE SAME

CROSS-REFERENCE TO RELATED APPLICATIONS

This application is a Continuation of U.S. patent application Ser. No. 10/619,431, filed Jul. 16, 2003 now U.S. Pat. No. 7,038,281, and claims priority to Japanese Patent Application No. 2003-53090, filed Feb. 28, 2003. The contents of these applications are incorporated herein by reference in their entirety.

BACKGROUND OF THE INVENTION

1. Field of the Invention

The present invention relates to a semiconductor device, and more particularly to a CMOS transistor structure which provides for footprint savings.

2. Description of the Background Art

In employing a CMOS (Complementary Metal Oxide Semiconductor) transistor structure to form a semiconductor device, there is a need of connecting one of opposite $N^+$-type active regions of an n-channel MOS transistor and one of opposite $P^+$-type active regions of a p-channel MOS transistor, each of which is located in an outer portion of the CMOS transistor structure formed of the n-channel MOS transistor and the p-channel MOS transistor. Also, a wire connecting the $N^+$-type active region and the $P^+$-type active region should be disposed so as to be spatially separated from a gate electrode in order to avoid electrical connection between the wire and the gate electrode. Additionally, one example of a semiconductor device with a CMOS transistor structure is a CMOS inverter.

Another example is a nonvolatile semiconductor memory device as disclosed in Japanese Patent Application Laid-Open No. 2000-323590 (pages 9 through 12 and FIGS. 1 through 8), in which an interconnect layer buried in a self-aligned contact and a gate electrode are prevented from being short-circuited to each other.

While there has been no significant progress or change in a semiconductor device with a CMOS transistor structure with respect to a function thereof, attempts have been made with respect to a configuration, to reduce a footprint of the CMOS transistor structure. However, in accordance with conventional practices, reduction of a footprint of a CMOS transistor structure in a semiconductor device has been subject to some constraints. One constraint is that a gate electrode and a wire connecting an $N^+$-type active region and a $P^+$-type active region should not overlap each other in plan view, in order to prevent the wire and the gate electrode from being electrically connected to each other. Another constraint is that a predetermined distance should be kept between the gate electrode and the wire connecting the $N^+$-type active region and the $P^+$-type active region, in order to allow for variations possibly caused during formation of the wire in manufacture of the device (an alignment error, for example).

SUMMARY OF THE INVENTION

It is an object of the present invention to provide a semiconductor device with a CMOS transistor structure, in which a gate electrode and a wire connecting an $N^+$-type active region and a $P^+$-type active region overlap each other in plan view, to reduce a footprint of the CMOS transistor structure.

According to a first aspect of the present invention, a semiconductor device with a CMOS transistor includes a plurality of gate electrodes, an n-channel MOS region, a p-channel MOS region and a wire. The plurality of gate electrodes are arranged in parallel with one another. The n-channel MOS region and the p-channel MOS region of the CMOS transistor are arranged adjacent to each other in a lengthwise direction of the plurality of gate electrodes. The wire connects the n-channel MOS region and the p-channel MOS region, and has a width greater than a distance between every two adjacent ones of the plurality of gate electrodes. Further, a portion of the wire is disposed right above a portion of the gate electrode with an insulating film interposed therebetween.

The semiconductor device provides for reduction of a footprint of the CMOS transistor structure as compared to a conventional semiconductor device. Further, the distance between every two adjacent ones of the gate electrodes can be governed by a design rule without having to take into account the wire.

According to a second aspect of the present invention, a method of manufacturing a semiconductor device with a CMOS transistor includes a step of forming a gate electrode, a step of forming an insulating film, a step of forming an interlayer insulating film, a step of forming a first opening, a step of depositing a metal film and a step of removing a metal film. In the step of forming a gate electrode, a plurality of gate electrodes are formed so as to be arranged in parallel with one another on a semiconductor substrate. In the step of forming an insulating film, an insulating film is formed on a top face and a side face of the gate electrode. In the step of forming an interlayer insulating film, an interlayer insulating film made of a material different from a material for the insulating film, is formed on the insulating film. In the step of forming a first opening, etching is carried out on the interlayer insulating film using the insulating film as an etch stop layer, to form a first opening having a width greater than a distance between every two adjacent ones of the plurality of gate electrodes. In the step of depositing a metal film, a metal film is deposited on the interlayer insulating film. In the step of removing a metal film, the metal film on the interlayer insulating film, except a portion thereof which is buried in the first opening, is removed.

The method of manufacturing a semiconductor device provides for formation of a semiconductor device in which a self-aligned contact is formed and an insulating film serving as an etch stop layer is surely interposed between a wire and a gate electrode which partly overlap each other in plan view.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiments

Below, the present invention will be described in detail, with reference to accompanying drawings which illustrate preferred embodiments of the present invention.

First Preferred Embodiment

Figure 1:
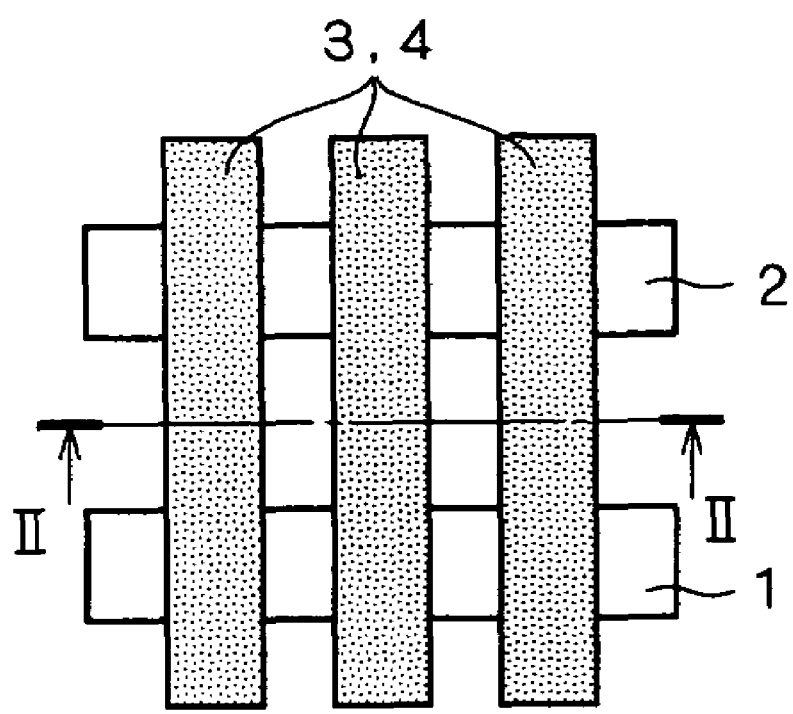
FIG. 1 is a plan view of a semiconductor device according to a first preferred embodiment of the present invention.
Figure 2:
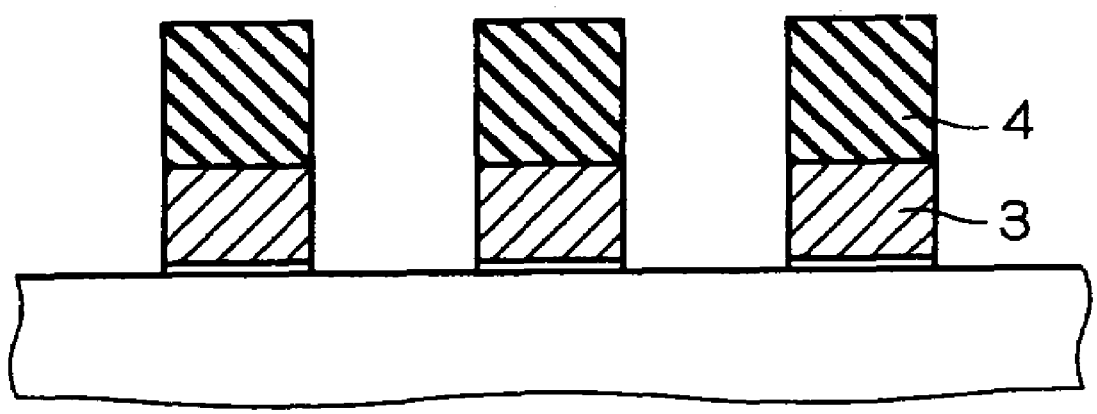
FIG. 2 is a sectional view of the semiconductor device according to the first preferred embodiment of the present invention.

A semiconductor device with a CMOS transistor structure according to a first preferred embodiment will be described hereinafter by taking a CMOS inverter as a non-limiting example. FIG. 1 is a plan view of the semiconductor device according to the first preferred embodiment, at one stage during manufacture thereof. FIG. 2 is a sectional view of the semiconductor device according to the first preferred embodiment, at the same stage during manufacture thereof as in FIG. 1. In FIG. 1, an $N^+$-type active region 1 of an n-channel MOS transistor and a $P^+$-type active region 2 of a p-channel MOS transistor are formed in a surface portion of a semiconductor substrate by ion implantation or the like. Further, gate electrodes 3 each used in both the n-channel MOS transistor and the p-channel MOS transistor are formed on the $N^+$-type active region 1 and the $P^+$-type active region 2 by photolithography. The semiconductor device according to the first preferred embodiment can be regarded as including an n-channel MOS region where the n-channel MOS transistor is formed and a p-channel MOS region where the p-channel MOS transistor is formed.

The gate electrodes 3 are arranged orthogonally to the $N^+$-type active region 1 and the $P^+$-type active region 2. Further, insulating films 4 made of silicon nitride are deposited on the gate electrodes 3 by CVD (Chemical Vapor Deposition) or the like, as illustrated in FIG. 2. FIG. 2 is a sectional view taken along a line II-II in FIG. 1, which illustrates the gate electrodes 3 and the insulating films 4 sequentially deposited on the semiconductor substrate. A distance between every two adjacent ones of the gate electrodes 3 may be governed by a design rule (i.e., a minimum distance which can be achieved by photolithography used in manufacture).

Figure 3:
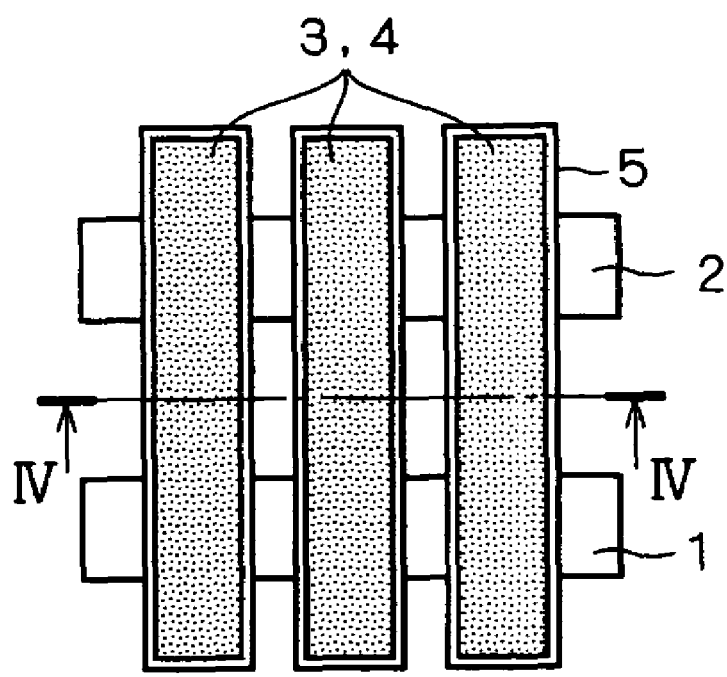
FIG. 3 is a plan view of the semiconductor device according to the first preferred embodiment of the present invention.
Figure 4:
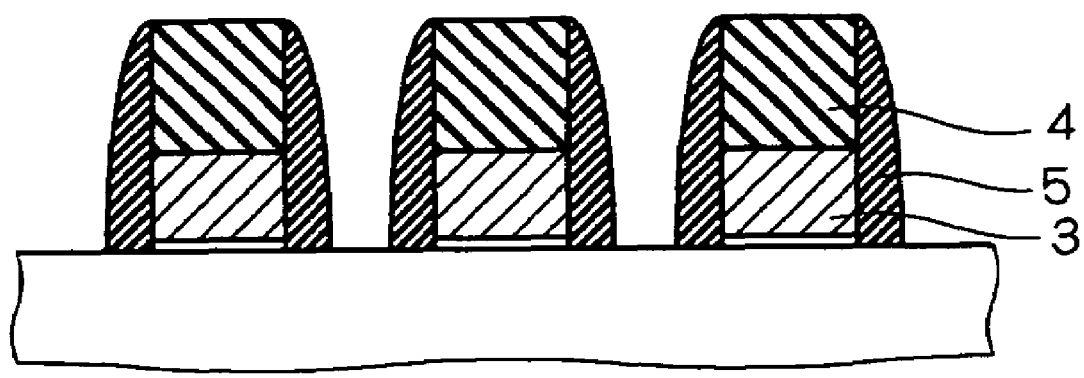
FIG. 4 is a sectional view of the semiconductor device according to the first preferred embodiment of the present invention.

FIG. 3 is a plan view of the semiconductor device according to the first preferred embodiment, at one stage during manufacture thereof. FIG. 4 is a sectional view of the semiconductor device according to the first preferred embodiment, at the same stage during manufacture thereof as in FIG. 3. As illustrated in FIG. 3, an insulating film 5 made of silicon nitride is formed on each of side faces of the gate electrodes 3 by CVD or the like. The insulating film 5 may be called a sidewall. FIG. 4 is a sectional view taken along a line IV-IV in FIG. 3. As illustrated in FIG. 4, each of the gate electrodes 3 is covered with the insulating films 4 and 5 with no portion thereof being exposed.

Figure 5:
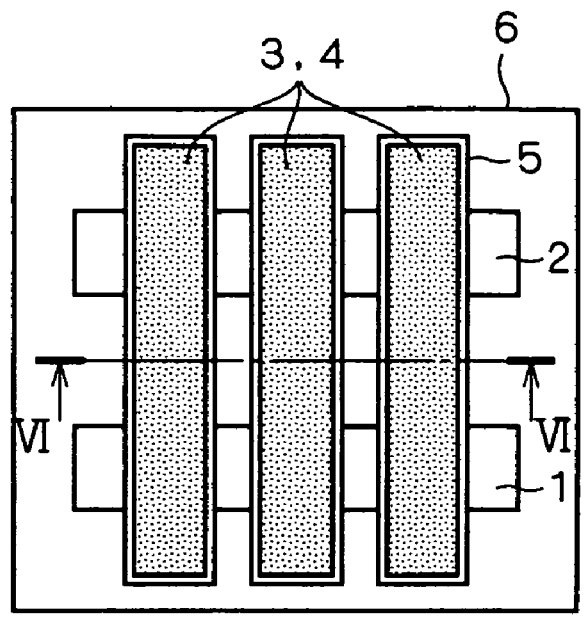
FIG. 5 is a plan view of the semiconductor device according to the first preferred embodiment of the present invention.
Figure 6:
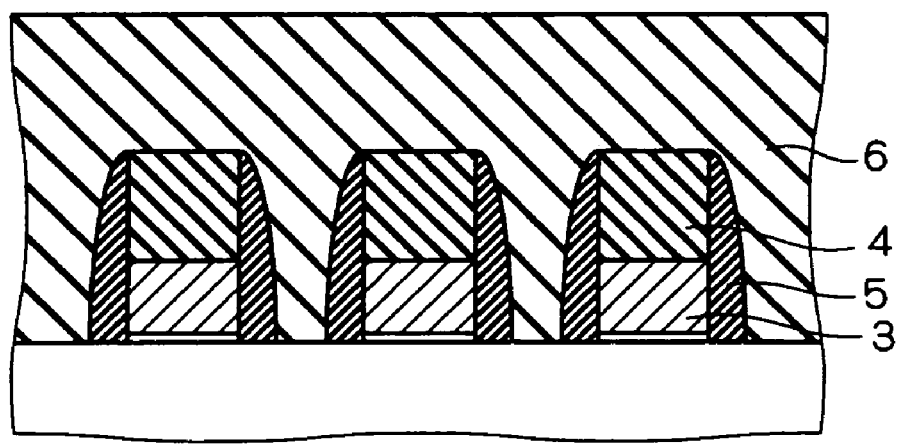
FIG. 6 is a sectional view of the semiconductor device according to the first preferred embodiment of the present invention.

FIG. 5 is a plan view of the semiconductor device according to the first preferred embodiment, at one stage during manufacture thereof. FIG. 6 is a sectional view of the semiconductor device according to the first preferred embodiment, at the same stage during manufacture thereof as in FIG. 5. As illustrated in FIG. 5, an interlayer insulating film 6 made of silicon oxide is formed over the gate electrodes 3 covered with the insulating films 4 and 5, by CVD or the like. FIG. 6 is a sectional view taken along a line VI-VI in FIG. 5. As illustrated in FIG. 6, the interlayer insulating film 6 is planarized by CMP or the like in order to achieve a uniform distance from a top face of the interlayer insulating film 6 to the insulating films 4, as a preparation to make openings which are to be formed for accommodating wires connecting the $N^+$-type active region 1 and the $P^+$-type active region 2, uniform in size.

Figure 7:
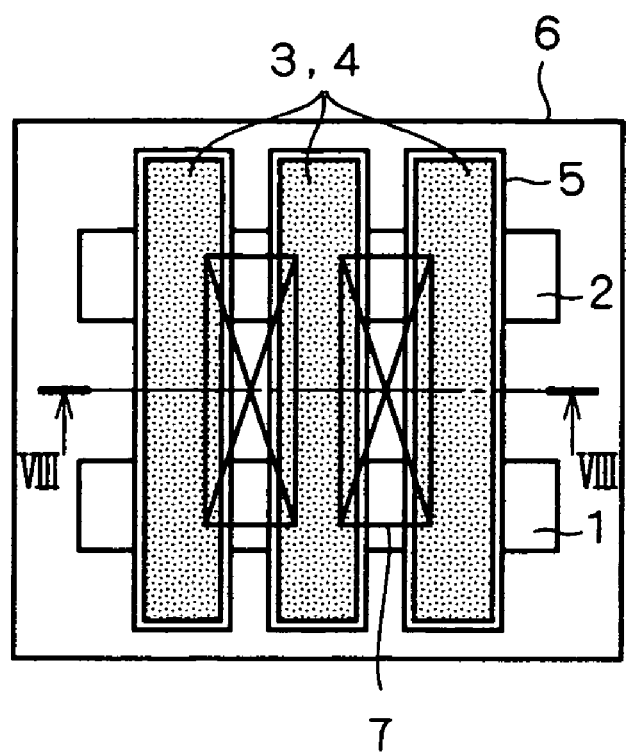
FIG. 7 is a plan view of the semiconductor device according to the first preferred embodiment of the present invention.
Figure 8:
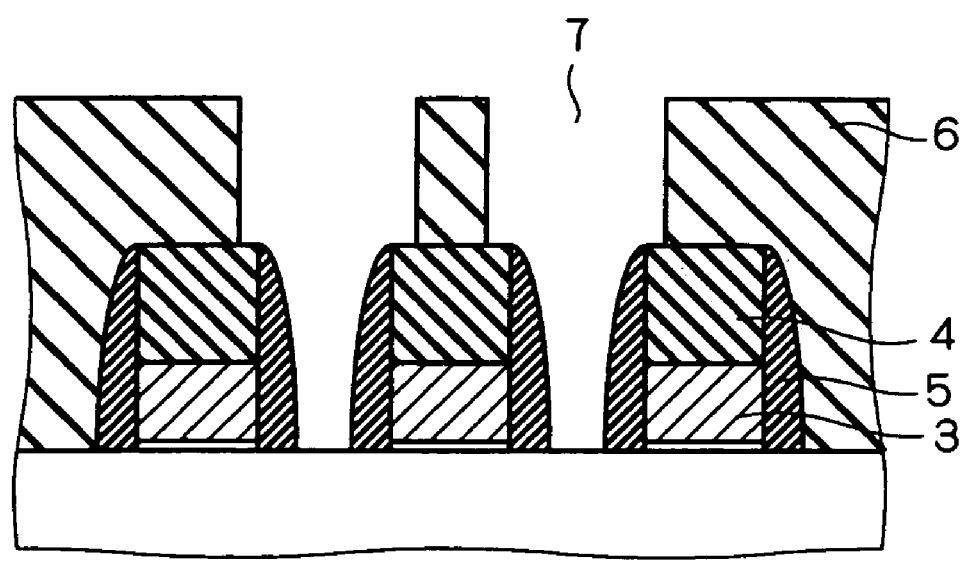
FIG. 8 is a sectional view of the semiconductor device according to the first preferred embodiment of the present invention.

FIG. 7 is a plan view of the semiconductor device according to the first preferred embodiment, at one stage during manufacture thereof. FIG. 8 is a sectional view of the semiconductor device according to the first preferred embodiment, at the same stage during manufacture thereof as in FIG. 7. As illustrated in FIG. 7, openings 7 for accommodating the wires connecting the $N^+$-type active region 1 and the $P^+$-type active region 2 are formed in the interlayer insulating film 6. Each of the openings 7, the greatest width of which is greater than the distance between every two adjacent ones of the gate electrodes 3, has a two-part structure formed of an upper opening and a lower opening. Each of the upper openings is formed by etching a portion of the interlayer insulating film 6 to a depth at which the top face of one of the insulating films 4 which serves as an etch stop layer exists. This etching process is carried out under process condition which allows a high etch selectivity of an oxide film relative to a nitride film by an order of magnitude or more.

Each of the lower openings is formed by etching a portion of the interlayer insulating film 6 using the insulating films 5 as an etch stop layer, to expose a portion of a top face of each of the $N^+$-type active region 1 and the $P^+$-type active region 2. In view of the fact that the insulating films 4 and 5 are used as an etch stop layer in forming the openings 7, each of the openings 7 is a self-aligned contact. This ensures that the insulating films 4 and 5 are interposed between each of wires to be buried in the openings 7 and each of the gate electrodes 3 which partly overlap each other in plan view.

Accordingly, it is possible to prevent the wires buried in the openings 7 and the gate electrodes 3 from being electrically connected to each other.

Figure 9:
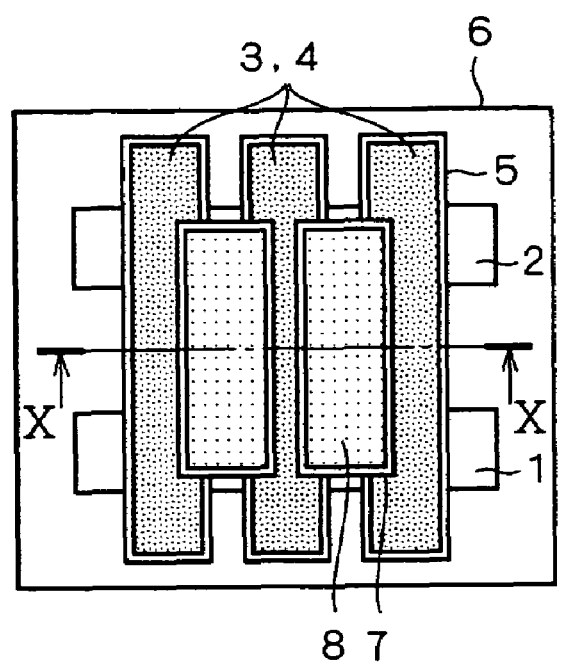
FIG. 9 is a plan view of the semiconductor device according to the first preferred embodiment of the present invention.
Figure 10:
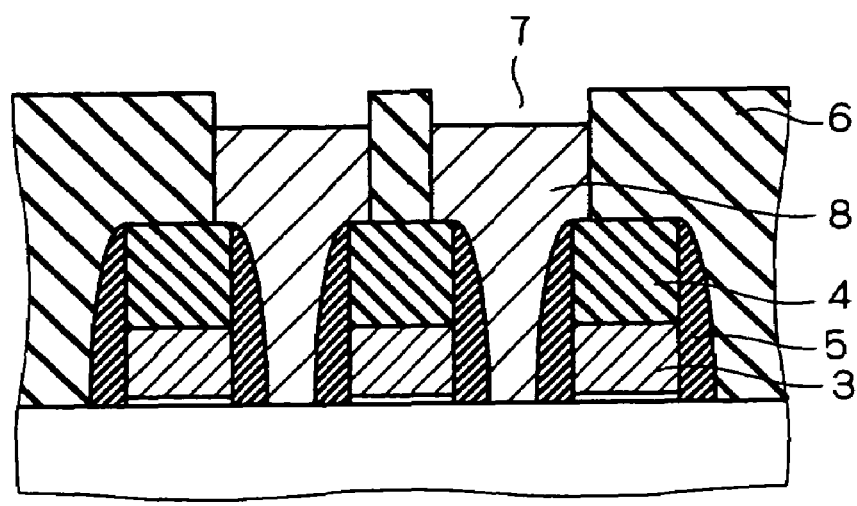
FIG. 10 is a sectional view of the semiconductor device according to the first preferred embodiment of the present invention.

FIG. 8 is a sectional view taken along a line VIII-VIII in FIG. 7. As illustrated in FIG. 8, a metal film such as an aluminum film is buried in the openings 7. More specifically, a metal film is deposited in the openings 7 and on the interlayer insulating film 6 by sputtering or the like, and then CMP or the like is carried out to remove each portion of the metal film which is not buried in the openings 7, thereby to planarize the metal film. As a result, wires 8 (hereinafter, referred to as "buried wires 8") connecting the N$^+$-type active region 1 and the P$^+$-type active region 2 are formed as illustrated in FIGS. 9 and 10. FIG. 9 is a plan view of the semiconductor device according to the first preferred embodiment. FIG. 10 is a sectional view of the semiconductor device according to the first preferred embodiment, taken along a line X-X in FIG. 9. The greatest width of each of the buried wires 8 is greater than the distance between every two adjacent ones of the gate electrodes 3. The buried wires 8 are located in part thereof right above portions of the gate electrodes 3 with the insulating films 4 interposed therebetween. It is additionally noted that a technique used for planarizing the metal film is not limited to CMP. Alternatively, etch back can be used, in which the metal film is anisotropically etched so that only a projecting portion of the metal film can be selectively removed.

Figure 11A:
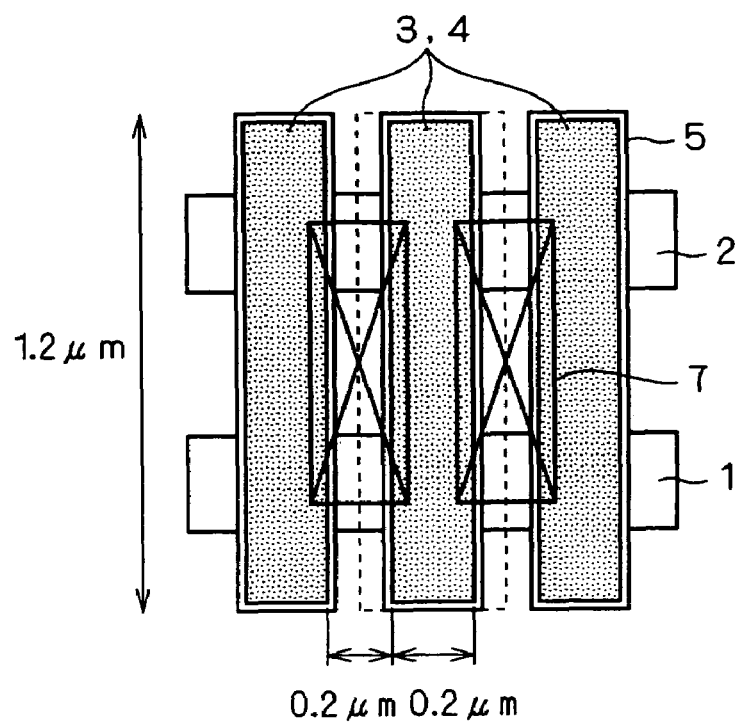
FIG. 11A is a plan view of the semiconductor device according to the first preferred embodiment of the present invention.

FIG. 11A is a plan view of an example of the semiconductor device (CMOS inverter) according to the first preferred embodiment. In the example of FIG. 11A, a 0.2-µm design rule is employed, so that the distance between every two adjacent ones of the gate electrodes 3 is 0.2 µm. Accordingly, a footprint of a CMOS transistor structure in this example of the CMOS inverter which is indicated by a broken line in FIG. 11A is 1.2 µm×(0.1 µm+0.2 µm+0.1 µm)=0.48 µm$^2$.

Figure 11B:
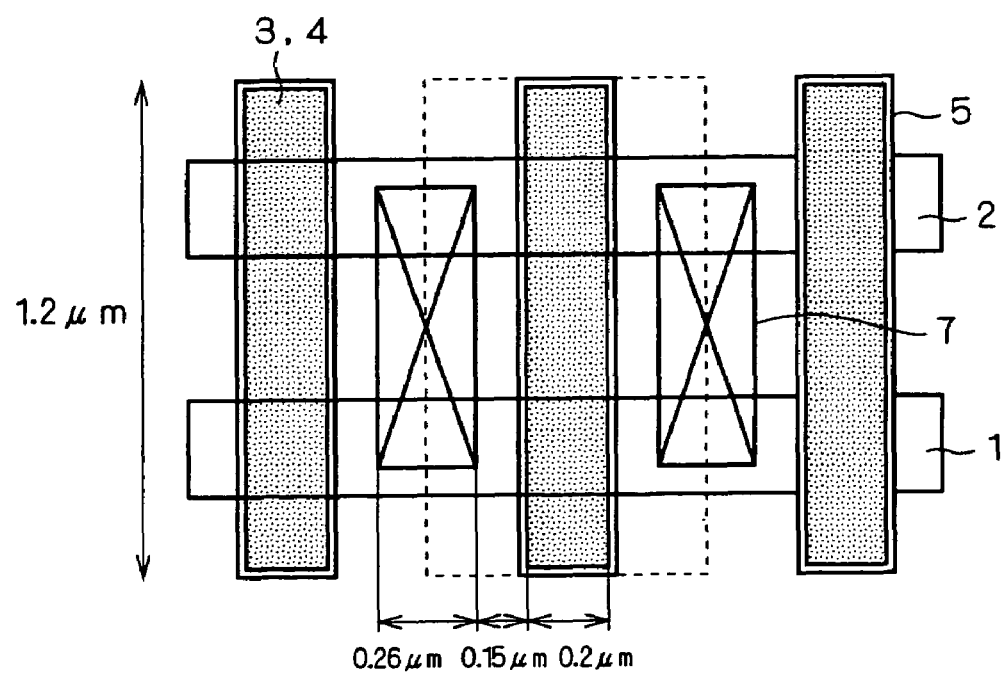
FIG. 11B is a plan view of a conventional semiconductor device.

For the purpose of comparison, one example of a conventional CMOS inverter is shown in FIG. 11B. As shown in FIG. 11B, the conventional CMOS inverter is configured such that the buried wires 8 and the gate electrodes 3 do not overlap one another in plan view. In the example of FIG. 11B, a 0.2-µm design rule is employed and a margin of 0.15 µm is left during manufacture in order to avoid overlap between the buried wires 8 and the gate electrodes 3. Accordingly, a footprint of a CMOS transistor structure in this example of the conventional CMOS inverter which is indicated by a broken line in FIG. 11B is 1.2 µm×(0.13 µm+0.15 µm+0.2 µm+0.15 µm +0.13 µm)=0.91 µm$^2$. As is appreciated from comparison between the examples shown in FIGS. 11A and 11B, the CMOS inverter having the structure according to the first preferred embodiment (in a typical case where a gate electrode of the CMOS inverter has a width (W) of approximately 1 µm) provides for reduction of a footprint of the CMOS transistor structure by about 50% relative to the conventional CMOS inverter.

As described above, the semiconductor device with a CMOS transistor structure according to the first preferred embodiment, includes the gate electrodes 3 and the buried wires 8 connecting the n-channel MOS region and the p-channel MOS region. The semiconductor device is configured such that the greatest width of each of the buried wires 8 is greater than the distance between every two adjacent ones of the gate electrodes 3, and the buried wires 8 are located in part thereof right above portions of the gate electrodes 3 with the insulating films 4 interposed therebetween. This provides for reduction of a footprint of the CMOS transistor structure in the entire device, as compared to the conventional semiconductor device. Also, it is possible to govern the distance between every two adjacent ones of the gate electrodes 3 by a design rule without having to take into account the buried wires 8.

Further, in the semiconductor device according to the first preferred embodiment, the insulating films 4 and 5 are formed on the top faces and the side faces of the gate electrodes 3, and then the buried wires 8 are buried in the openings 7 which are formed by carrying out etching on the interlayer insulating film 6 using the insulating films 4 and 5 as an etch stop layer. Thus, the openings 7 are self-aligned contacts. This ensures that the insulating films 4 and 5 serving as an etch stop layer are interposed between each of the buried wires 8 and each of the gate electrodes 3 which partly overlap each other in plan view. Moreover, a method of manufacturing a semiconductor device according to the first preferred embodiment, as described above, provides for formation of the semiconductor device in which self-aligned contacts are formed and the insulating films 4 and 5 serving as an etch stop layer are surely interposed between each of the buried wires 8 and each of the gate electrodes 3 which partly overlap each other in plan view.

Furthermore, in the method of manufacturing a semiconductor device according to the first preferred embodiment, the buried wires 8 may be formed by carrying out etch back on a metal film deposited on the interlayer insulating film 6 in which the openings 7 have been formed. This simplifies a process, as compared to a method which includes CMP for treating the metal film.

Second Preferred Embodiment

Figure 12:
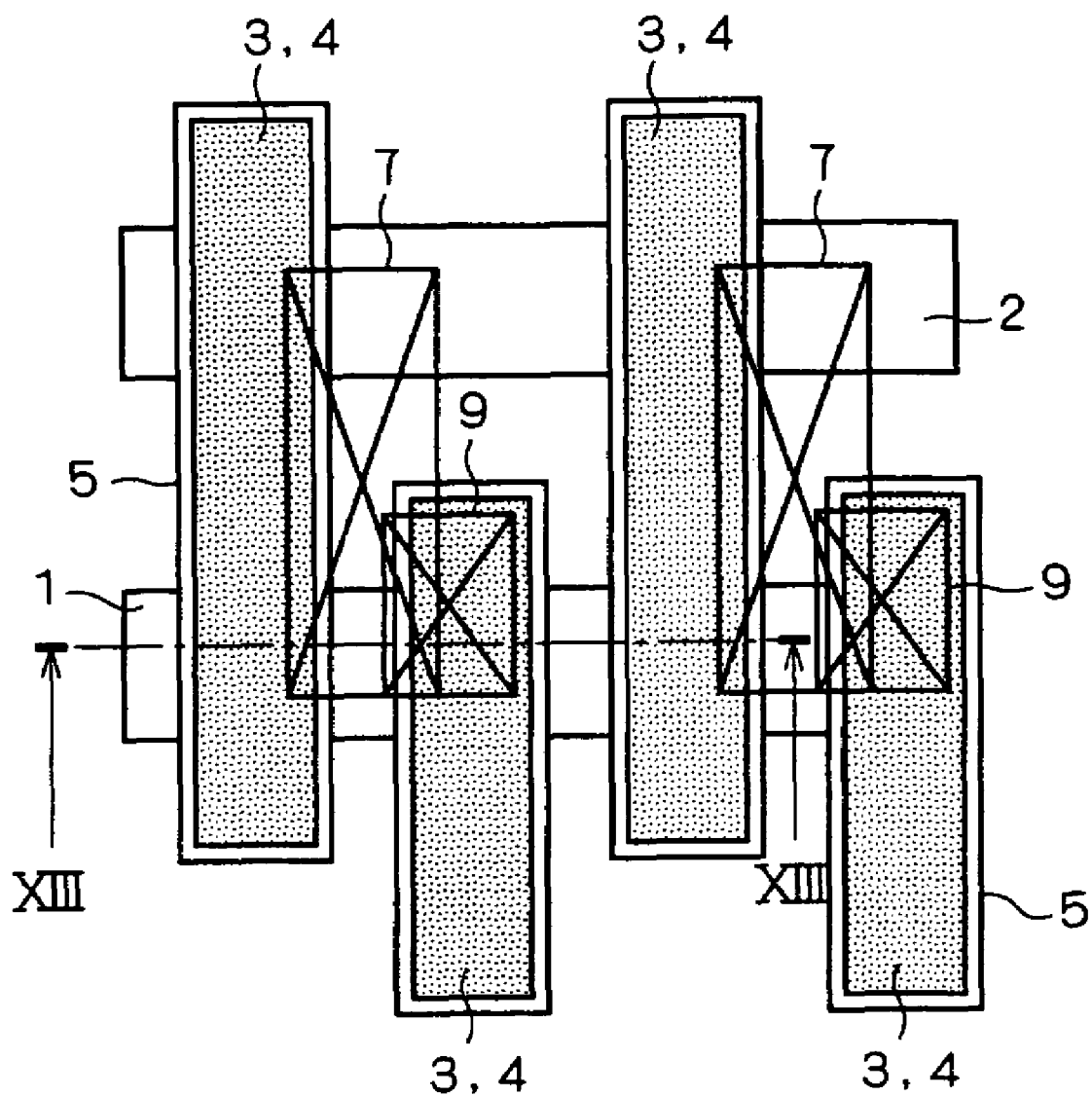
FIG. 12 is a plan view of a semiconductor device according to a second preferred embodiment of the present invention.

Also a semiconductor device with a CMOS transistor structure according to a second preferred embodiment will be described by taking a CMOS inverter as a non-limiting example. FIG. 12 is a plan view of the semiconductor device according to the second preferred embodiment. In an analogous manner to the first preferred embodiment, according to the second preferred embodiment, the CMOS inverter includes the N$^+$-type active region 1 of the n-channel MOS transistor and the P$^+$-type active region 2 of the p-channel MOS transistor which are formed in a surface portion of a semiconductor substrate by ion implantation or the like. Further, the gate electrodes 3 each used in both the n-channel MOS transistor and the p-channel MOS transistor are formed on the N$^+$-type active region 1 and the P$^+$-type active region 2 by photolithography.

The gate electrodes 3 are arranged orthogonally to the N$^+$-type active region 1 and the P$^+$-type active region 2. Moreover, the insulating films 4 and 5 made of silicon nitride are formed on the gate electrodes 3. The interlayer insulating film 6 made of silicon oxide is formed over the gate electrodes 3 covered with the insulating films 4 and 5, by CVD or the like. It is noted that illustration of the interlayer insulating film 6 is omitted in FIG. 12. Then, the openings 7 for accommodating the wires connecting the N$^+$-type active region 1 and the P$^+$-type active region 2 are formed in the interlayer insulating film 6. Each of the openings 7, the greatest width of which is greater than a distance between every two adjacent ones of the gate electrodes 3, has a two-part structure formed of an upper opening and a lower opening.

Each of the upper openings of the openings 7 is formed by etching a portion of the interlayer insulating film 6 to a depth at which a top face of one of the insulating films 4 which serves as an etch stop layer exists. This etching process is carried out under process condition which allows a high etch selectivity of an oxide film relative to a nitride film by an order of magnitude or more. Each of the lower openings of the openings 7 is formed by etching a portion of the interlayer insulating film 6 using the insulating films 5 as an etch stop layer, to expose a portion of a top face of each of the $N^+$-type active region 1 and the $P^+$-type active region 2. In view of the fact that the insulating films 4 and 5 are used as an etch stop layer in forming the openings 7, each of the openings 7 is a self-aligned contact.

According to the second preferred embodiment, openings 9 are additionally formed on the gate electrodes 3 so that portions of the gate electrodes 3 are exposed. Each of the openings 9 is formed by etching respective predetermined portions of one of the insulating films 4 and one of the insulating films 5, by photolithography. Then, a metal film such as an aluminum film is buried in the openings 7 and 9. More specifically, a metal film is deposited in the openings 7 and 9 and the interlayer insulating film 6 by sputtering or the like, and then CMP or the like is carried out to remove each portion of the metal film which is not buried in the openings 7 and 9, thereby to planarize the metal film. As a result, the buried wires 8 are formed. The greatest width of each of the buried wires 8 is greater than the distance between every two adjacent ones of the gate electrodes 3. The buried wires 8 are located in part thereof right above portions of the gate electrodes 3 with the insulating films 4 interposed therebetween.

Figure 13:
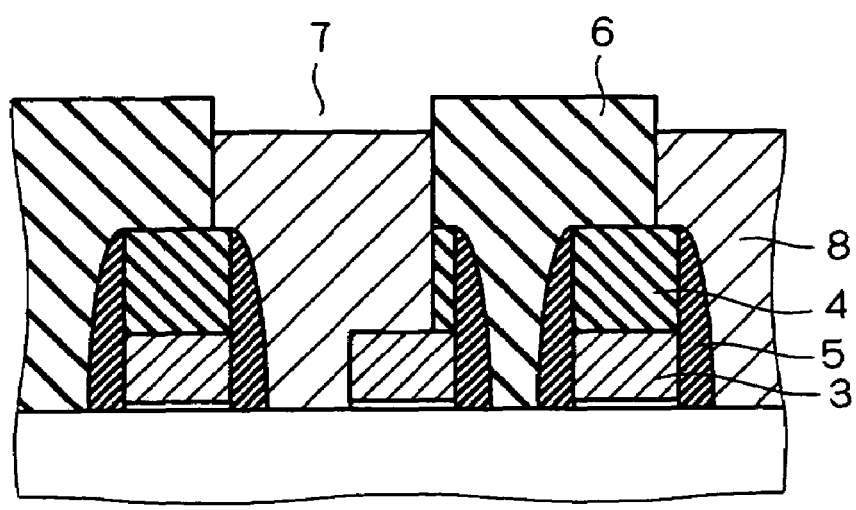
FIG. 13 is a sectional view of the semiconductor device according to the second preferred embodiment of the present invention.

FIG. 13 is a sectional view of the semiconductor device according to the second preferred embodiment. FIG. 13 is a sectional view taken along a line XIII-XIII in FIG. 12. FIG. 13 illustrates a state where respective portions of one of the insulating films 4 and one of the insulating films 5 have been removed as a result of forming the opening 9 so that one of the buried wires 8 is electrically connected to one of the gate electrodes 3. Additionally, also in the second preferred embodiment, a technique used for planarizing the metal film for forming the buried wires 8 is not limited to CMP. Alternatively, etch back can be carried out on the metal film deposited on the interlayer insulating film 6 having the openings 7 and 9 formed therein, to form the buried wires 8. To employ etch back would simplify a process, as compared to a case where CMP is employed for treating the metal film.

Figure 14:
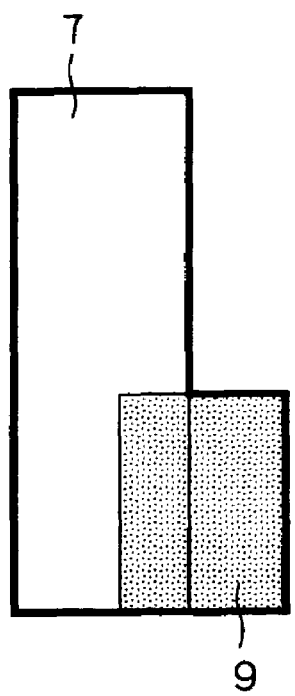
FIG. 14 is a plan view of an opening according to the second preferred embodiment of the present invention.

Each of the openings 7 and each of the openings 9 are provided so as to form one continuous opening which provides not a rectangular shape, but a shape having six corners or more, in the interlayer insulating film 6 in plan view. FIG. 14 is a plan view of the opening formed of one of the openings 7 and one of the openings 9. The opening which provides a shape having six corners or more in plan view allows electrical connection to be established at more portions in the device than an opening which is simply rectangular in plan view. This increases flexibility in layout of the semiconductor device.

As described above, in the semiconductor device according to the second preferred embodiment, the buried wires 8 are further provided in the openings 9 which are formed by removing portions of the insulating films 4 and 5, to be electrically connected to the gate electrodes 3. This makes it possible to obtain a configuration which allows the buried wires 8 to be connected to the gate electrodes 3, as well as to reduce a footprint of the CMOS transistor structure as compared to the conventional device. Also, a method of manufacturing a semiconductor device according to the second preferred embodiment, as described above, provides for formation of a semiconductor device in which a footprint of a CMOS transistor structure included therein is reduced as compared to the conventional semiconductor device and the buried wires 8 can be connected to the gate electrodes 3.

Further, in the semiconductor device according to the second preferred embodiment, each of the openings 7 and each of the openings 9 form one continuous opening which provides a shape having six corner or more in the interlayer insulating film 6 in plan view. This makes it possible to establish electrical connection between regions located not in line with each other, thereby to increase flexibility in layout of the semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   plural CMOS transistors comprising,
   first and second transistors sharing a common first gate electrode and third and fourth transistors sharing a common second gate electrode that is adjacent and parallel to the first gate electrode, said first and third transistors sharing a common n-type channel MOS region and said second and fourth transistors sharing a common p-type channel MOS region; and
   a wire connecting said n-type channel MOS region and said p-type channel MOS region,
   wherein said wire has such a width to cover said first and second adjacent gate electrodes, and
   a portion of said wire is disposed right above a portion of at least one of the first and second gate electrodes with an insulating film interposed therebetween.

2. The semiconductor device according to claim 1,
   wherein said insulating film is formed on a top face and a side face of said gate electrode, and
   said wire is buried in a first opening formed by carrying out etching on an interlayer insulating film which is deposited on said insulating film and is made of a material different from a material for said insulating film.

3. The semiconductor device according to claim 2,
   wherein said wire is further buried in a second opening formed in said insulating film, to be electrically connected to said gate electrode.

4. The semiconductor device according to claim 3,
   wherein said first opening and said second opening form one opening which provides a shape having six corners or more in said interlayer insulating film in plan view.

5. A semiconductor device comprising:
   first and second transistors sharing a common first gate electrode and third and fourth transistors sharing a common second gate electrode that is adjacent and parallel to the first gate electrode, said first and third transistors sharing a common n-type region and said second and fourth transistors sharing a common p-type region;
   a first insulating film formed on said first gate electrode and a second insulating film formed on said second gate electrode;
   a third insulating film formed on a side surface of said first electrode and a side surface of said first insulating film, and a fourth insulating film formed on a side surface of said second gate electrode and a side surface of said second insulating film;
   an interlayer insulating film formed over and between said first and said second gate electrodes, and having an opening exposing said third and fourth insulating films and said first and second insulating films located between said first and said second electrodes, wherein said opening is located above said common n-type region and said common p-type region; and a buried wiring formed in said opening and not extending over said interlayer insulating film, wherein said buried wiring extends above said first insulating film, [and] said second insulating film, said third insulating film, and said fourth insulating film, and wherein said buried wiring contacts said common n-type region and said common p-type region.

6. A semiconductor device according to claim 5, wherein said first, second, third and fourth insulating films are made of a material different from said interlayer insulating film.

7. A semiconductor device according to claim 6, wherein said buried wiring is electrically connected to said common n-type region and said common p-type region.

8. A semiconductor device comprising:

a semiconductor substrate;

first and second gate electrodes formed over said semiconductor substrate;

p-type regions located at both sides of said first gate electrode;

n-type regions located at both sides of said second gate electrode;

a first insulating film formed on said first gate electrode and a second insulating film formed on said second gate electrode;

a third insulating film formed on a side surface of said first gate electrode and a side surface of said first insulating film, and a fourth insulating film formed on a side surface of said second gate electrode and a side surface of said second insulating film;

an interlayer insulating film formed over and between said first and said second gate electrodes, and having an opening exposing said third and fourth insulating films and said first and second insulating films located between said first and said second electrodes, wherein said opening is located above said one of p-type regions and said second gate electrode; and a buried wiring formed in said opening and not extending over said interlayer insulating film, wherein said buried wiring extends above said first insulating film formed over said first gate electrode, [and] extends above said second insulating film formed over said second gate electrode, extends above said third insulating film, and extends above said fourth insulating film, wherein said buried wiring connects at least one of said p-type regions and at least one of said n-type regions, and wherein said one of p-type region is electrically connected to said second gate electrode via said buried wiring.

9. A semiconductor device according to claim 8, wherein said first, second, third and fourth insulating films are made of a material different from said interlayer insulating film.

* * * * *